(12) United States Patent
Chen et al.

(10) Patent No.: US 10,148,286 B2
(45) Date of Patent: Dec. 4, 2018

(54) KEYBOARD SCANNING CIRCUIT, KEYBOARD AND SCANNING METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Chien-Chih Chen, New Taipei (TW); Er-Hao Chen, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 13 days.

(21) Appl. No.: 15/010,912

(22) Filed: Jan. 29, 2016

(65) Prior Publication Data

US 2017/0054450 A1 Feb. 23, 2017

(30) Foreign Application Priority Data

Aug. 17, 2015 (CN) .......................... 2015 1 0504743

(51) Int. Cl.
*G06F 3/02* (2006.01)
*H01H 13/70* (2006.01)
*H03M 11/20* (2006.01)
*G06F 3/023* (2006.01)

(52) U.S. Cl.
CPC ........... *H03M 11/20* (2013.01); *G06F 3/0202* (2013.01); *G06F 3/023* (2013.01)

(58) Field of Classification Search
CPC .... G06F 3/0202; H01H 13/70; Y10T 307/937
See application file for complete search history.

(56) References Cited

U.S. PATENT DOCUMENTS

| | | | | |
|---|---|---|---|---|
| 5,798,716 A | * | 8/1998 | Davis | .................... G06F 1/1662 341/22 |
| 5,983,116 A | * | 11/1999 | Nash | ...................... H03M 11/24 341/26 |
| 9,240,295 B2 | * | 1/2016 | Choo | ...................... H01H 13/70 |
| 2001/0054971 A1 | * | 12/2001 | King | ...................... H03M 11/20 341/22 |

* cited by examiner

*Primary Examiner* — Muhammad N Edun
*Assistant Examiner* — Jerold Murphy
(74) *Attorney, Agent, or Firm* — Li & Cai Intellectual Property (USA) Office (57) ABSTRACT

A keyboard scanning circuit includes a plurality of switching elements, M scanning lines and N sensing lines. Each of the sensing lines has a common node extended to M transmission lines. A switching element is coupled where one of the transmission lines and one of the scanning lines intersects. Two scanning lines correspondingly coupled through two switching elements to two transmission lines extended from one sensing line are different from each other.

12 Claims, 7 Drawing Sheets

|      | S3 | S2 | S1 | S0 | R1  | R0  |
|------|----|----|----|----|-----|-----|
| SC1  | Z  | Z  | Z  | 0  | SW5 | SW1 |
| SC2  | Z  | Z  | 1  | 0  | SW5 | SW1 |
| SC3  | Z  | 1  | Z  | 0  | SW5 | SW1 |
| SC4  | 1  | Z  | Z  | 0  | SW5 | SW1 |
| SC5  | Z  | Z  | 0  | Z  | SW6 | SW2 |
| SC6  | Z  | Z  | 0  | 1  | SW6 | SW2 |
| SC7  | Z  | 1  | 0  | Z  | SW6 | SW2 |
| SC8  | 1  | Z  | 0  | Z  | SW6 | SW2 |
| SC9  | Z  | 0  | Z  | Z  | SW7 | SW3 |
| SC10 | Z  | 0  | Z  | 1  | SW7 | SW3 |
| SC11 | Z  | 0  | 1  | Z  | SW7 | SW3 |
| SC12 | 1  | 0  | Z  | Z  | SW7 | SW3 |
| SC13 | 0  | Z  | Z  | Z  | SW8 | SW4 |
| SC14 | 0  | Z  | Z  | 1  | SW8 | SW4 |
| SC15 | 0  | Z  | 1  | Z  | SW8 | SW4 |
| SC16 | 0  | 1  | Z  | Z  | SW8 | SW4 |

KEYBOARD SCANNING CIRCUIT, KEYBOARD AND SCANNING METHOD THEREOF

BACKGROUND

1. Technical Field

The present invention generally relates to a keyboard scanning circuit, a keyboard and a scanning method thereof and, more particularly to, a keyboard scanning circuit, a keyboard and a scanning method thereof capable of preventing ghost keys.

2. Description of Related Art

The keyboard scanning circuit in an existing keyboard utilizes a scanning matrix composed of scanning lines and sensing lines crisscrossed. A key is provided corresponding to where one of the scanning lines and one of the sensing lines intersects. However, ghost keys are inevitable on such a keyboard scanning circuit. To date, there have been some solutions to key ghosting, for example, by adding a diode to each key or enhancing the I/O capability of a microprocessor to augment the scanning matrix.

SUMMARY

The present invention provides a keyboard scanning circuit, a keyboard and a scanning method thereof, using simple hardware design to prevent ghost keys.

One embodiment of the present invention provides a keyboard scanning circuit including a plurality of switching elements, M scanning lines and N sensing lines. Each of the sensing lines has a common node extended to M transmission lines. One of the switching elements is provided where one of the transmission lines and one of the scanning lines intersects. Two of the scanning lines coupled through two of the switching elements to two of the transmission lines extended from one of the sensing lines are different from each other.

One embodiment of the present invention provides a keyboard including a plurality of switching elements, M scanning lines, N sensing lines and a microprocessor. Each of the sensing lines has a common node extended to M transmission lines. The microprocessor is coupled to the scanning lines and the sensing lines. One of the switching elements is provided where one of the transmission lines and one of the scanning lines intersects. Two of the scanning lines coupled through two of the switching elements to two of the transmission lines extended from one of the sensing lines are different from each other. The microprocessor outputs a scanning signal through the scanning lines and receives a sensing signal through the sensing lines so as to determine the state of each of the switching elements.

One embodiment of the present invention provides a keyboard scanning method for a keyboard. The keyboard scanning circuit includes a plurality of switching elements, M scanning lines and N sensing lines. Each of the sensing lines has a common node extended to M transmission lines. One of the switching elements is provided where one of the transmission lines and one of the scanning lines intersects. Two of the scanning lines coupled through two of the switching elements to two of the transmission lines extended from one of the sensing line are different from each other. The keyboard scanning method includes steps herein. A scanning signal is outputted through the scanning lines. A sensing signal is received through the sensing lines. The state of each of the switching elements is determined according to the sensing signal.

In the present invention, a keyboard scanning circuit is provided. A switching element is provided where one of the sensing lines and one of the scanning lines intersects. In a circuit including M scanning lines and N sensing lines, the microprocessor uses one of the M scanning lines as a scanning confirmation line and one of the N sensing lines as a sensing confirmation line. The microprocessor outputs multiple sets of the scanning signals being different to the M scanning lines and reads the scanning signals from the N sensing lines to determine whether the switching element coupled to the scanning confirmation line and the sensing confirmation line is turned on to prevent ghost keys. Therefore, the keyboard scanning circuit in the present invention is capable of preventing ghost keys and improving the precision of the output signal when the key on the keyboard is pressed.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

The detailed description set forth below in connection with the appended drawings is intended as a description of certain embodiments of the present disclosure, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present disclosure.

Figure 1:
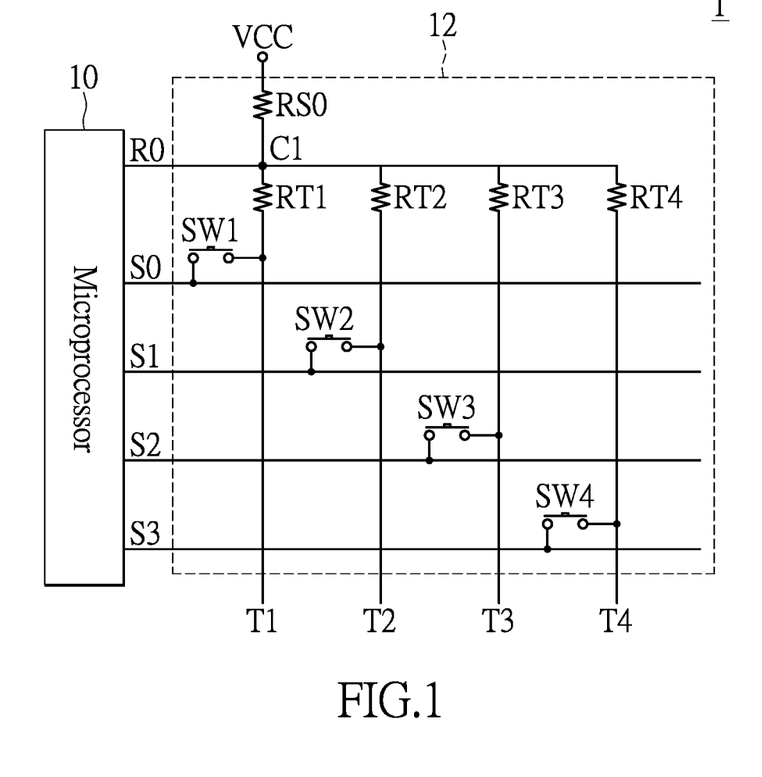
FIG. 1 is a schematic diagram of a keyboard scanning circuit according to one embodiment of the present invention.

FIG. 1 is a schematic diagram of a keyboard scanning circuit according to one embodiment of the present invention. Referring to FIG. 1, the keyboard 1 includes a microprocessor 10 and a keyboard scanning circuit 12. The microprocessor 10 is coupled to the keyboard scanning circuit 12. The keyboard scanning circuit 12 includes a plurality of switching elements, M scanning lines and N sensing lines. As an example, in the present embodiment, the M scanning lines are exemplified by four scanning lines S0~S3, the N sensing lines are exemplified by a sensing line R0. The plurality of switching elements are exemplified by four switching elements SW1~SW4. In other present embodiments, M is, for example, 2, 3, 5, 6 or other positive integers, and N is, for example, 1, 2, 3, 4 . . . , 31, 32 or other positive integers. The present invention is, however, not limited to the previous examples of M and N.

In the present embodiment, the microprocessor 10 is coupled to four scanning lines S0~S3 and a sensing line R0. It should be noted that the sensing line R0 has a common node C1, which is extended to M transmission lines. In the present embodiment, the M transmission lines are exemplified by four transmission lines T1~T4. The number of the transmission lines T1~T4 extended from the sensing line R0 equals to the number of the scanning lines S0~S3. In other words, if the number of the scanning lines is five, the number of the transmission lines extended from the sensing line R0 is also five. Therefore, in FIG. 1, the four transmission lines T1~T4 extended from the sensing line R0 and the four scanning lines S0~S3 may provide sixteen intersections.

As shown in FIG. 1, a switching element SW1 is provided where the scanning line S0 and the transmission line T1 intersects. A switching element SW2 is provided where the scanning line S1 and the transmission line T2 intersects. A switching element SW3 is provided where the scanning line S2 and the transmission line T3 intersects. A switching element SW4 is provided where the scanning line S3 and the transmission line T4 intersects. Moreover, in the present embodiment, the number of the switching elements is defined by the product of the number of the scanning lines and the number of the sensing lines. For example, in FIG. 1, the number of the scanning lines S0~S3 is four and the number of the sensing line R0 is one. As a result, there are four switching elements SW1~SW4.

In the present embodiment, not all the intersections of the transmission lines T1~T4 extended from the sensing line R0 and the scanning lines S0~S3 are provided with a switching element. Instead, a switch element is provided where one of the scanning lines S0~S3 and one of the transmission lines T1~T4 extended from the sensing line R0 intersect. Two of the scanning lines coupled through two of the switching elements to two of the transmission lines T1~T4 extended from the sensing line R0 are different from each other. For example, the transmission line T1 is coupled through the switching element SW1 to the scanning line S0, and the transmission line T2 is coupled through the switching element SW2 to the scanning line S1. Accordingly, the scanning lines coupled through the switching elements, respectively, to the transmission lines T1 and T2 are different from each other. In short, in the present embodiment, the switching elements are disposed so that the microprocessor 10 precisely determines whether each of the switching elements SW1~SW4 is turned on or off to prevent ghost keys.

Moreover, in the present embodiment, the common node C1 on the sensing line R0 in the keyboard scanning circuit 12 is coupled to a first resistor RS0 and M second resistors RT1~RT4. In the present embodiment, the M second resistors are exemplified by four second resistors RT1~RT4, and the resistance of the first resistor RS0 is much larger than the resistance of each of the second resistors RT1~RT4. The first resistor RS0 is coupled between a voltage source VCC and the common node C1. The second resistors RT1~RT4 are coupled between the common node C1 and each of the transmission lines T1~T4. Therefore, the voltage source VCC provides a divided voltage level at the common node C1 by a voltage-divider circuit composed of the first resistor RS0 and the second resistors RT1~RT4. The divided voltage level varies according to the on/off state of the switching elements.

For example, when each of the switching elements SW1~SW4 is turned off, the voltage source VCC fails to provide a conductive loop through the first resistor RS0 and the second resistors RT1~RT4. Meanwhile, the common node C1 is provided with a second logic level. The second logic level is exemplified with a logic level herein. On the contrary, when one of the switching elements SW1~SW4 is turned on, the voltage source VCC provides a conductive loop through the first resistor RS0 and the second resistors RT1~RT4 coupled to a switching element that is turned on. Meanwhile, the common node C1 is provided with a first logic level. The first logic level is exemplified by a low logic level herein. Accordingly, the microprocessor 10 may determine whether the switching elements SW1~SW4 are turned on or off according to the voltage level of the common node C1 being the first logic level or the second logic level.

Hardware implementation of the keyboard 1 of the present invention has been described. In the present embodiment, the keyboard 1 operates based on the microprocessor 10 that outputs a scanning signal through scanning lines S0~S3 and receives a sensing signal through the sensing line R0 to determine the state of each of the switching elements SW1~SW4 according to the sensing signal.

In one embodiment, the microprocessor 10 determines the state of each of the switching elements SW1~SW4 by performing a scanning confirmation process on each of the switching elements SW1~SW4. The scanning confirmation process uses one of the scanning lines S0~S3 as a scanning confirmation line and one of the sensing lines as a sensing confirmation line. In FIG. 1, the sensing lines are exemplified by a sensing line R0 so that the sensing line R0 is used as a sensing confirmation line. Therefore, when the microprocessor 10 repeatedly outputs multiple sets of scanning signals being different through the scanning lines S0~S3, the microprocessor 10 acquires a plurality of sensing signals from the sensing confirmation line to perform a logic operation to acquire a sensed value. The microprocessor 10 determines the state of the switching element coupled to the scanning confirmation line and the sensing confirmation line according to the sensed value.

It should be noted that, the multiple sets of the scanning signals being different and outputted to the scanning confirmation line are at a first logic level, and the multiple sets of the scanning signals being different and outputted to the scanning lines except the scanning confirmation line vary in a range from a second logic level to a high-impedance logic level. In the present embodiment, the first logic level enables the switching element coupled to the scanning confirmation line to be turned on when being pressed. The range from the second logic level to the said high-impedance logic level enables the switching element coupled to the scanning lines except for the scanning confirmation line to be forbidden to be turned on when being pressed. Moreover, in the present embodiment, the logic operation is an "OR logic operation" performed by the microprocessor 10 acquiring the plurality of the sensing signals from the sensing confirmation line, to which the present invention is not limited.

For example, when a scanning confirmation process is performed on the switching element SW1, the scanning line S0 is used as a scanning confirmation line and the sensing line R0 is used as a sensing confirmation line. In the present embodiment, the microprocessor 10 performs scanning based on the number of the scanning lines. In other words, the microprocessor 10 outputs four sets of scanning signals to the scanning lines S0~S3. The four sets of scanning signals are described herein.

The first set of scanning signals (referred to as SC1): the scanning lines S1~S3 are inputted at a high-impedance logic level, and the scanning confirmation line (S0) is inputted at a first logic level.

The second set of scanning signals (referred to as SC2): the scanning lines S2~S3 are inputted at a high-impedance logic level, the scanning line S1 is inputted at a second logic level, and the scanning confirmation line (S0) is inputted at a first logic level.

The third set of scanning signals (referred to as SC3): the scanning lines S1 and S3 are inputted at a high-impedance logic level, the scanning line S2 is inputted at a second logic level, and the scanning confirmation line (S0) is inputted at a first logic level.

The fourth set of scanning signals (referred to as SC4): the scanning lines S1~S2 are inputted at a high-impedance logic level, the scanning line S3 is inputted at a second logic level, and the scanning confirmation line (S0) is inputted at a first logic level.

Therefore, when the microprocessor 10 outputs the scanning signals SC1~SC4, the microprocessor 10 acquires a plurality of the sensing signals through the sensing line R0 and performs "OR logic operation" on the sensing signals to acquire the sensed value. The microprocessor determines the state of the switching element SW1 according to the sensed value. For example, when the sensed value is at a first logic level, the microprocessor 10 determines that the switching element SW1 coupled to the scanning confirmation line and the sensing confirmation line is turned on. When the sensed value is at a second logic level, the microprocessor 10 determines that the switching element SW1 coupled to the scanning confirmation line and the sensing confirmation line is not turned on. Similarly, the state of each of the switching elements SW2~SW4 can be determined with the same manner.

Figure 2A:
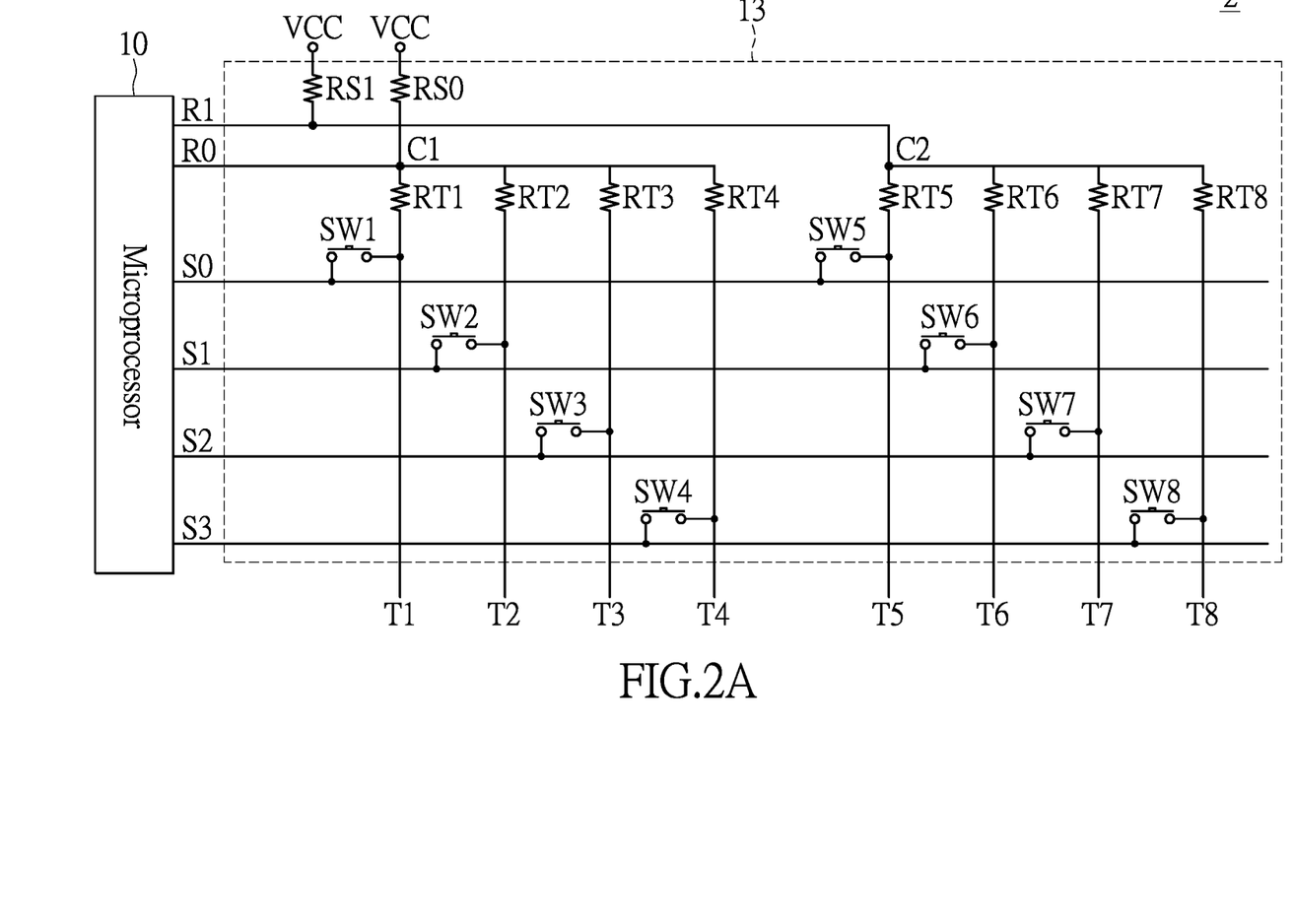
FIG. 2A is a schematic diagram of a keyboard scanning circuit according to another embodiment of the present invention.
Figure 2B:
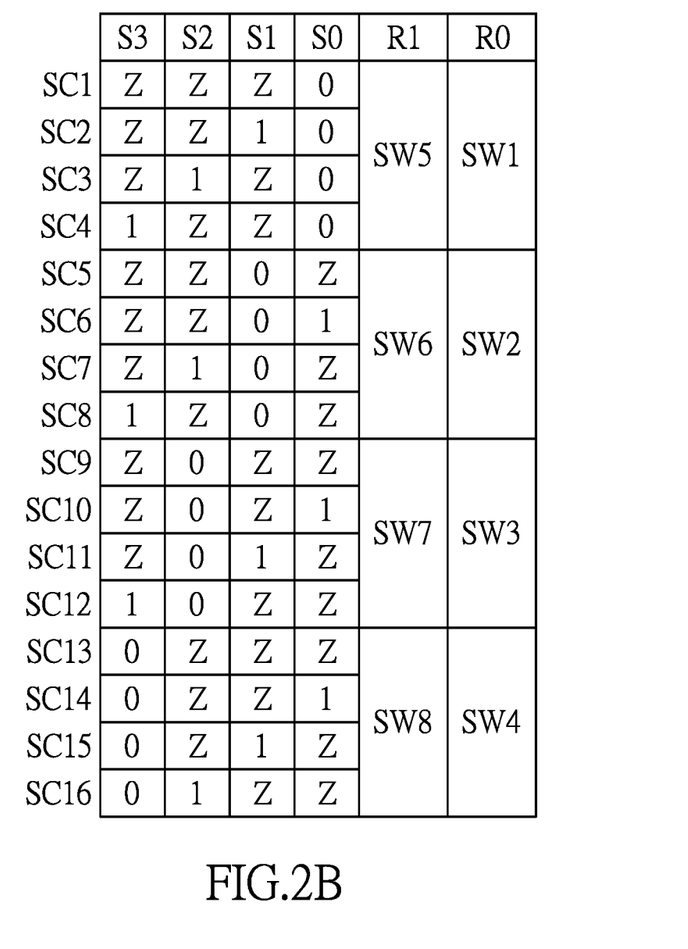
FIG. 2B is a look-up table with respect to the keyboard scanning circuit in FIG. 2A.

FIG. 2A is a schematic diagram of a keyboard scanning circuit according to another embodiment of the present invention. FIG. 2B is a look-up table with respect to the keyboard scanning circuit in FIG. 2A. Referring to FIG. 2A, the keyboard 2 in the present embodiment is different from the keyboard 1 in FIG. 1 in that the keyboard scanning circuit 13 further includes a sensing line R1 and switching elements SW5~SW8. The sensing line R1 has a common node C2 extended to four transmission lines T5~T8. A plurality of switching elements are provided between transmission lines T1~T8 and scanning lines S0~S3. Since, in FIG. 2A, the number of the scanning lines S0~S3 is four and the number of the sensing line R0~R1 is two, there are eight switching elements SW1~SW8 provided. In FIG. 2A, a switching element SW1 is provided where the scanning line S0 and the transmission line T1 intersects. A switching element SW2 is provided where the scanning line S1 and the transmission line T2 intersects. A switching element SW3 is provided where the scanning line S2 and the transmission line T3 intersects. A switching element SW4 is provided where the scanning line S3 and the transmission line T4 intersects. A switching element SW5 is provided where the scanning line S0 and the transmission line T5 intersects. A switching element SW6 is provided where the scanning line S1 and the transmission line T6 intersects. A switching element SW7 is provided where the scanning line S2 and the transmission line T7 intersects. A switching element SW8 is provided where the scanning line S4 and the transmission line T8 intersects.

In short, in the present embodiment, a switching element is provided where one of the scanning lines S0~S3 and one of the transmission lines T1~T8 intersects. Two of the scanning lines coupled through two of the switching elements to two of the transmission lines extended from the sensing lines R0 and R1 are different from each other.

Furthermore, in the present embodiment, the microprocessor 10 determines whether each of the switching elements SW1~SW4 is turned on or off through the sensing line R0 and the scanning lines S0~S3. The microprocessor 10 further determines whether each of the switching elements SW5~SW8 is turned on or off through the sensing line R1 and the scanning lines S0~S3.

Referring to FIG. 2B, the letter "Z" denotes a high-impedance logic level, "0" denotes a first logic level, and "1" denotes a second logic level. The scanning signals SC1~SC4 confirm the states of the switching elements SW1 and SW5, the scanning signals SC5~SC8 confirm the states of the switching elements SW2 and SW6, the scanning signals SC9~SC12 confirm the states of the elements SW3 and SW7, and the scanning signals SC13~SC16 confirm the states of the switching elements SW4 and SW8.

As previously stated with FIG. 1, the microprocessor 10 in FIG. 2A performs a scanning confirmation process on each of the switching elements SW1~SW8 so as to acquire the states of the switching elements SW1~SW8. For example, the microprocessor 10 determines the state of the switching element SW1 by outputting multiple sets of scanning signals SC1~SC4, using the scanning line S0 as a scanning confirmation line and the sensing line R0 as a sensing confirmation line, and acquiring corresponding multiple sensing signals from the sensing line R0 to perform an "OR logic operation" to obtain the sensed value. Similarly, the microprocessor 10 determines the state of the switching element SW5 by outputting multiple sets of scanning signals SC1~SC4, using the scanning line S0 as a scanning confirmation line and the sensing line R1 as a sensing confirmation line, and acquiring corresponding multiple sensing signals from the sensing line R1 to perform an "OR logic operation" to obtain the sensed value. The microprocessor 10 may further determine the states of the other switching elements similarly, and descriptions thereof are not repeated herein.

Figure 3:
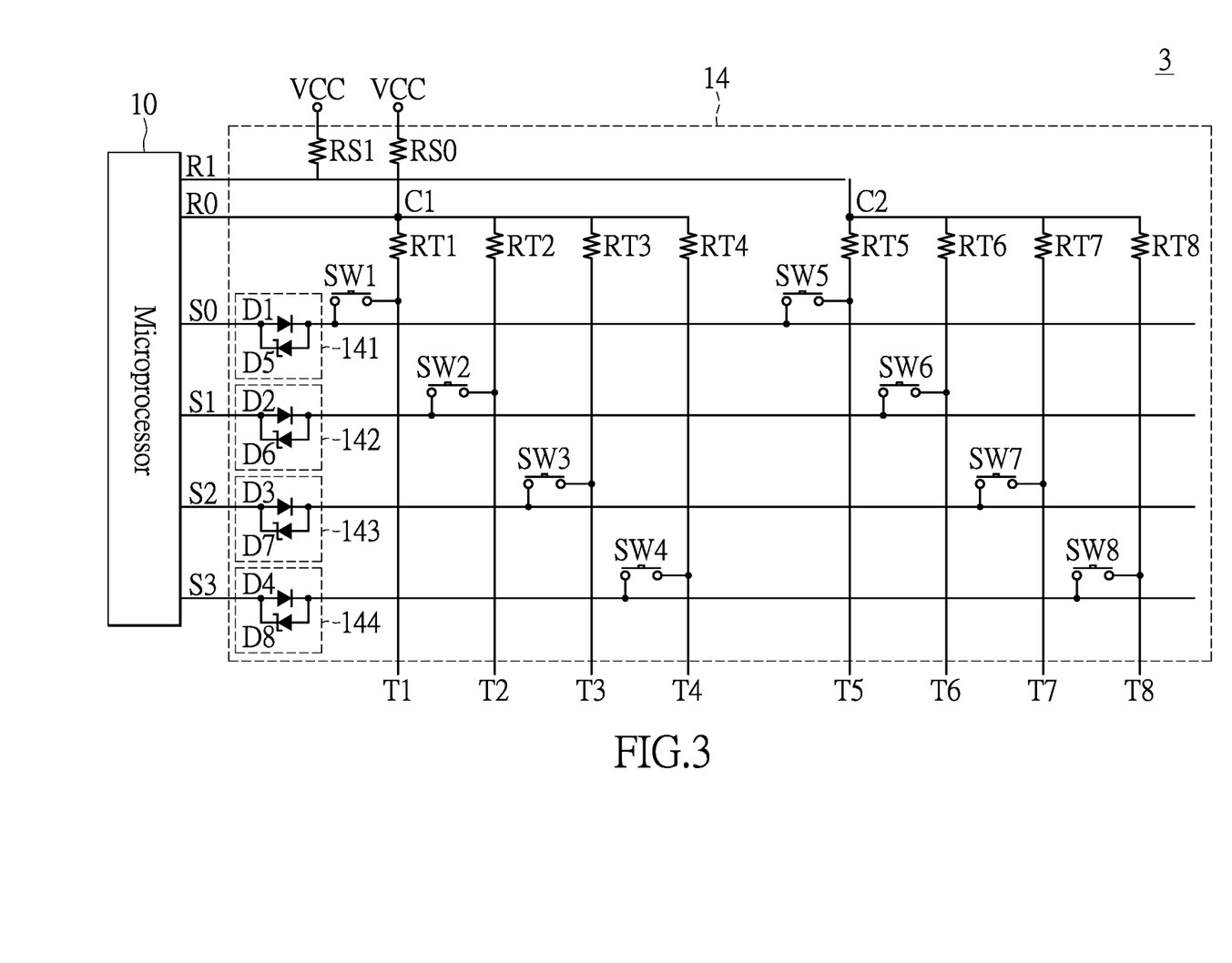
FIG. 3 is a schematic diagram of a keyboard scanning circuit according to another embodiment of the present invention.

Referring to FIG. 3, FIG. 3 is a schematic diagram of a keyboard scanning circuit according to another embodiment of the present invention. Compared to the keyboard 2 in FIG. 2A, the keyboard scanning circuit 14 in the keyboard 3 in the present embodiment further includes M reverse-current protection circuits. In the present embodiment, the M reverse-current protection circuits are exemplified by four reverse-current protection circuits 141~144. Furthermore, in the present embodiment, a reverse-current protection circuit is coupled between one of the scanning lines S0~S3 and the microprocessor 10. For example, in FIG. 3, a reverse-current protection circuit 141 is coupled between the scanning line S0 and the microprocessor 10, a reverse-current protection circuit 142 is coupled between the scanning line S1 and the microprocessor 10, a reverse-current protection circuit 143 is coupled between the scanning line S2 and the microprocessor 10, and a reverse-current protection circuit 144 is coupled between the scanning line S3 and the microprocessor 10.

Practically, each of the reverse-current protection circuits includes a diode and a Zener diode. For example, in the reverse-current protection circuit 141, the diode D1 and the Zener diode D5 are connected in parallel. The anode of the diode D1 is coupled to the cathode of the Zener diode D5 and the microprocessor 10, while the cathode of the diode D1 is coupled to the anode of the Zener diode D5 and one terminal of the switching element SW1.

It should be noted that the reverse-current protection circuit is used to stabilize the signals outputted by the microprocessor 10 to the scanning lines S0~S3 to enable the microprocessor to precisely determine whether the switching elements SW1~SW8 are turned on or off. The reverse-current protection circuit is implemented by a diode and a Zener diode, to which the present invention is not limited.

Figure 4:
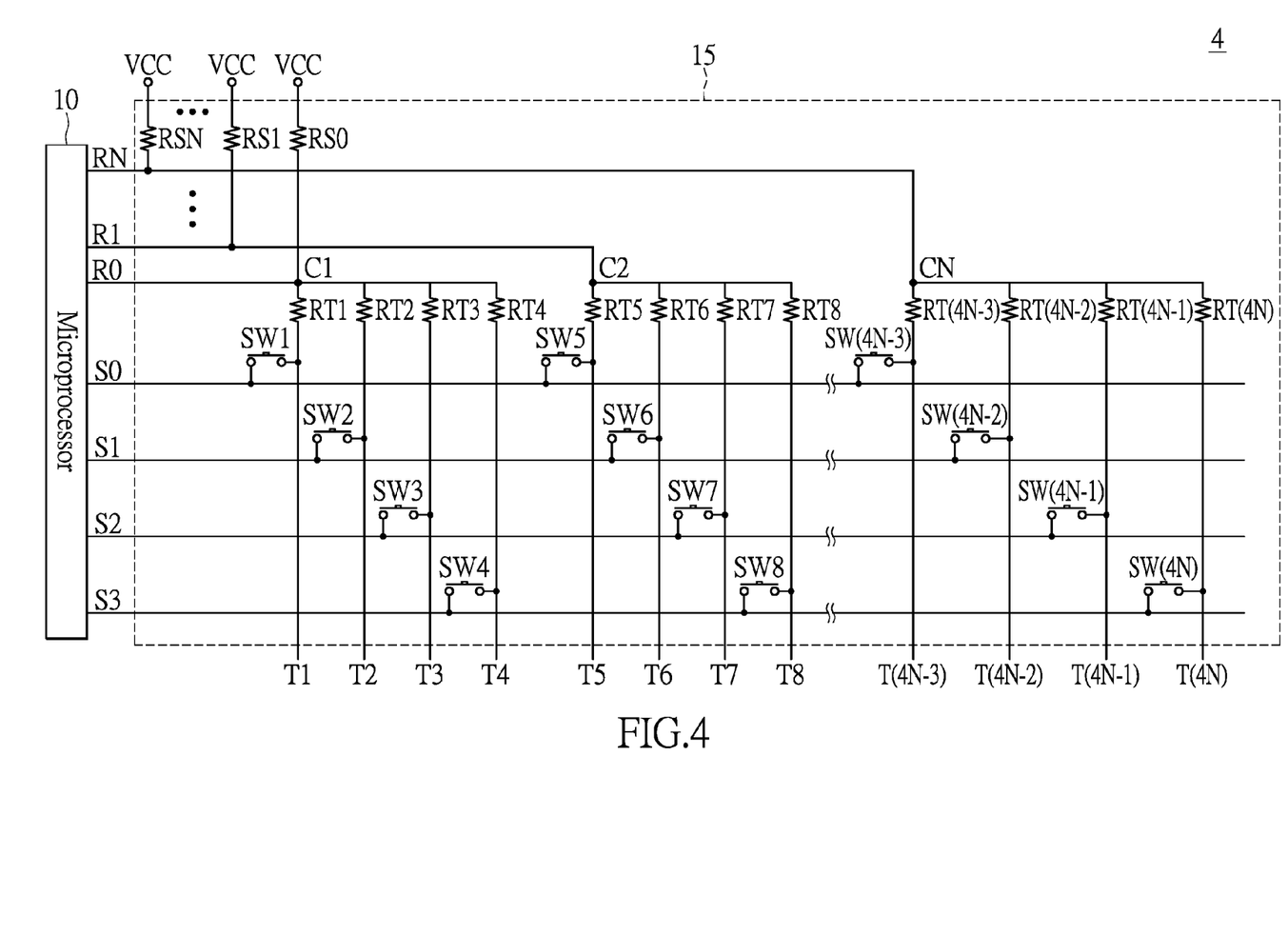
FIG. 4 is a schematic diagram of a keyboard scanning circuit according to another embodiment of the present invention.

Referring to FIG. 4, FIG. 4 is a schematic diagram of a keyboard scanning circuit according to another embodiment of the present invention. Compared to the keyboard 2 in FIG. 2A, the keyboard scanning circuit 15 in the keyboard 4 in the present embodiment further includes (N−2) sensing lines more than the keyboard 2. In other words, the keyboard scanning circuit 15 in the present embodiment includes N+1 sensing lines R0~RN and four scanning lines S0~S3. Accordingly, the keyboard scanning circuit 15 in the keyboard 4 includes (N+1)*4 switching elements. In other words, with the use of the circuit configuration as shown in FIG. 4, the number of the switching elements may be increased according to practical demands.

Figure 5:
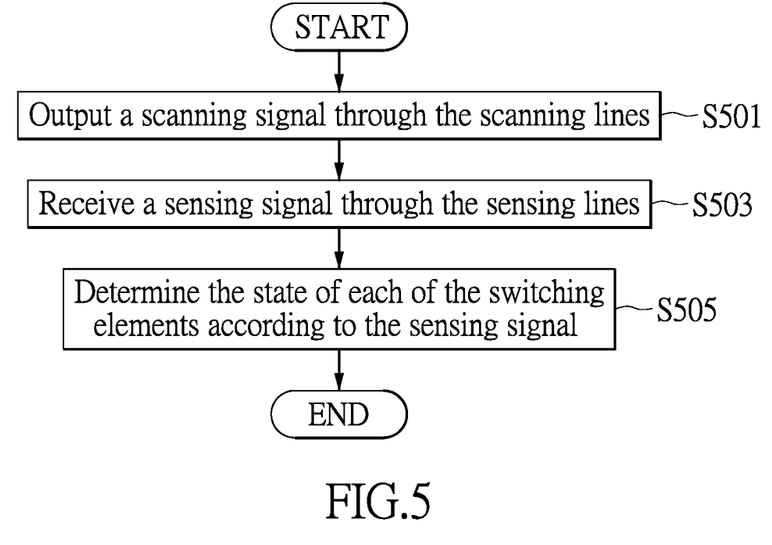
FIG. 5 is a flowchart of a keyboard scanning method according to one embodiment of the present invention.

Referring to FIG. 5, FIG. 5 is a flowchart of a keyboard scanning method according to one embodiment of the present invention. Referring also to FIG. 4, the keyboard scanning method includes steps herein.

In Step S501, a scanning signal is outputted through the scanning lines S0~S3. Then, in Step S503, a sensing signal is received through the sensing lines R0~RN. In Step S505, the microprocessor 10 determines the state of each of the switching elements according to the sensing signal. For example, when only the output from the scanning line S0 is at a first logic level and the switching element SW1 is pressed, the microprocessor 10 acquires the output at a first logic level from the sensing line R0. On the contrary, if the switching element SW1 is not pressed, the microprocessor 10 acquires the sensing signal at a second logic level from the sensing line R0.

The keyboard scanning method in FIG. 5 may be performed not only with the keyboard in FIG. 4, but also with the keyboards in FIG. 1, FIG. 2A, and FIG. 3, to which the present invention is not limited.

Figure 6:
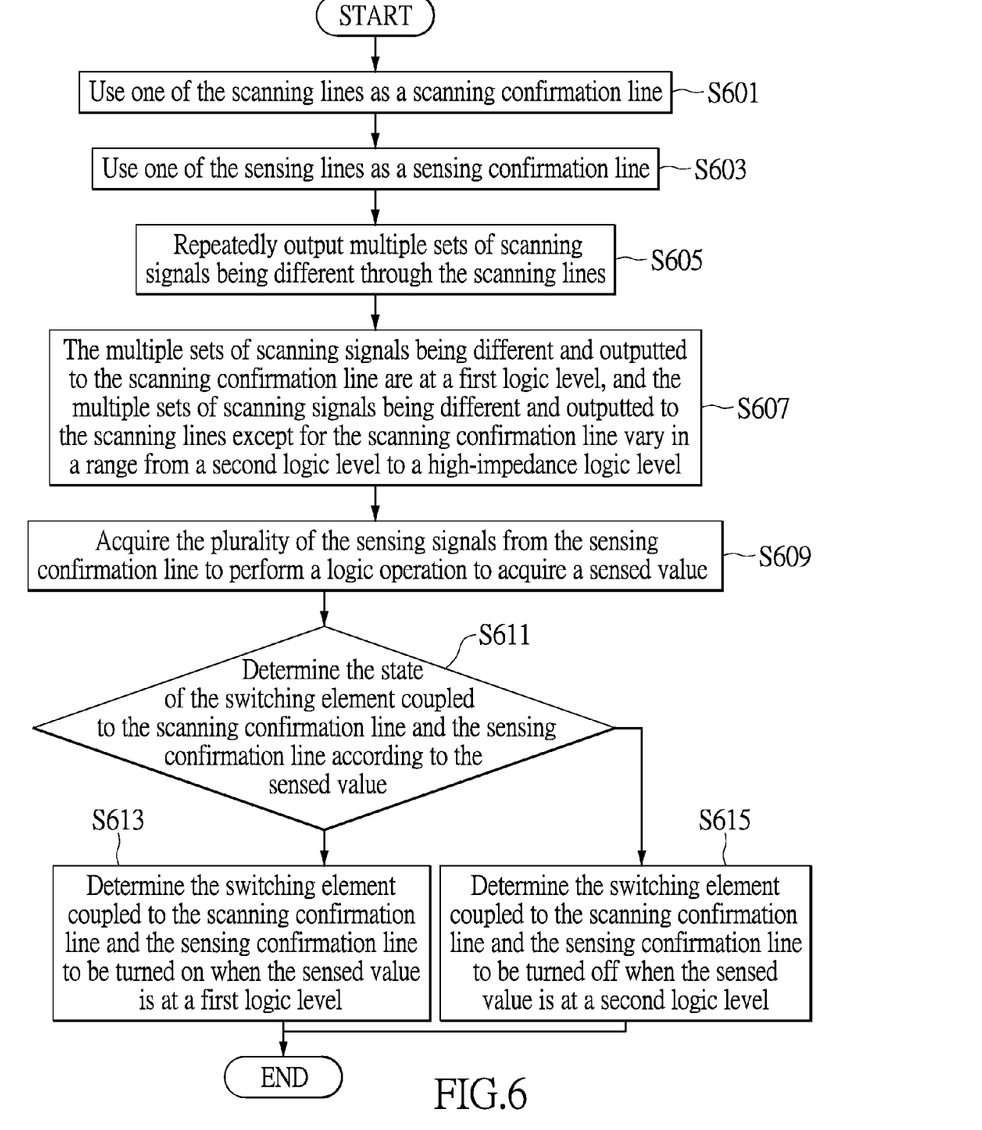
FIG. 6 is a flowchart of a scanning confirmation process according to one embodiment of the present invention.

Referring to FIG. 6, FIG. 6 is a flowchart of a scanning confirmation process according to one embodiment of the present invention. Referring also to FIG. 4, the scanning confirmation process in FIG. 6 includes the steps herein.

In Step S601, one of the scanning lines S0~S3 is used as a scanning confirmation line. Then, in Step S603, one of the sensing lines R0~RN is used as a sensing confirmation line. Practically, the microprocessor 10 determines the state of each of the switching elements according to the scanning confirmation line and the sensing confirmation line. For example, the microprocessor 10 uses the scanning line S0 as a scanning confirmation line, and the sensing line R1 as a sensing confirmation line so as to determine the state of the switching element SW5. For example, the microprocessor 10 uses the scanning line S2 as a scanning confirmation line, and the sensing line RN as a sensing confirmation line so as to determine the state of the switching element SW(4*N−2).

In Step S605, multiple sets of scanning signals being different are repeatedly outputted through the scanning lines S0~S3. In the present embodiment, the scanning signals are exemplified by four sets of scanning signals being different. In other present embodiments, the scanning signals may also be exemplified by one set, two sets, three sets or multiple sets of scanning signals being different. The present invention is, however, not limited to the previous examples of the scanning signals outputted from the scanning lines S0~S3.

In Step S607, the multiple sets of the scanning signals being different and outputted to the scanning confirmation line are at a first logic level, and the multiple sets of the scanning signals being different and outputted to the scanning lines S0~S3 except for the scanning confirmation line vary in a range from a second logic level to a high-impedance logic level. The first logic level enables the one of the switching elements coupled to the scanning confirmation line to be turned on when being pressed. The range from the second logic level to the said high-impedance logic level enables the one of the switching elements coupled to the scanning lines S0~S3 except for the scanning confirmation line to be forbidden to be turned on when being pressed.

Practically, the multiple sets of scanning signals being different are outputted to, for example, "the scanning confirmation line inputted by the microprocessor at a first logic level and the scanning lines S0~S3 except the scanning confirmation line inputted by the microprocessor at a high-impedance logic level" or "the scanning confirmation line inputted by the microprocessor at a first logic level, one of the scanning lines S0~S3, except the scanning confirmation line, inputted by the microprocessor at a second logic level, and the rest of the scanning lines S0~S3 inputted by the microprocessor at a high-impedance logic level" The present invention is not limited to the previous examples of multiple sets of the scanning signals being different and outputted to the scanning lines S0~S3.

In Step S609, the plurality of sensing signals are acquired from the sensing confirmation line to perform a logic operation to acquire a sensed value. Practically, the logic operation is an OR logic operation performed by the microprocessor acquiring the plurality of the sensing signals from the sensing confirmation line. Therefore, if one of the sensing signals is at a second logic level, the sensed value is also at a second logic level. If all of the sensing signals are at a first logic level, the sensed value is at a first logic level.

In Step S611, the state of the switching element coupled to the scanning confirmation line and the sensing confirmation line is determined according to the sensed value. The determination based on the sensed value may be referred to Step S613 and Step S615.

In Step S613, the switching element coupled to the scanning confirmation line and the sensing confirmation line is determined to be turned on when the sensed value is at a first logic level.

In Step S615, the switching element coupled to the scanning confirmation line and the sensing confirmation line is determined to be turned off when the sensed value is at a second logic level.

The scanning confirmation process in FIG. 6 may be performed not only with the keyboard in FIG. 4, but also with the keyboards in FIG. 1, FIG. 2A, and FIG. 3, to which the present invention is not limited. Moreover, the scanning confirmation process in FIG. 6 is a step for determining the states of the switching elements in the keyboard scanning method in FIG. 5 to provide more precise determination and prevent misjudgment.

To sum up, the keyboard and the scanning method thereof in the present invention are presented with simple hardware design in the previous embodiments to prevent ghost keys.

The above-mentioned descriptions represent merely the exemplary embodiments of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A keyboard, comprising:
a plurality of switching elements;
M scanning lines;
N sensing lines, each of said sensing lines having a common node extended to M transmission lines; and
a microprocessor, coupled to said scanning lines and said sensing lines;
wherein one of said switching elements is provided where one of said transmission lines and one of said scanning lines intersects, and two of said scanning lines coupled through two of said switching elements to two of said transmission lines extended from one of said sensing line are different from each other;
wherein said common node of each of said sensing lines is coupled to a first resistor and M second resistors, wherein said first resistor is directly coupled between a voltage source and said common node, and said second resistors are directly coupled between said common node and said transmission lines;
wherein said microprocessor outputs a scanning signal through said scanning lines and receives a sensing signal through said sensing lines so as to determine the state of each of said switching elements;
wherein the number of said switching elements is defined by the product of the number of said scanning lines and the number of said sensing lines; and
wherein said microprocessor determines the state of each of said switching elements by performing a scanning confirmation process on one of said switching elements, said scanning confirmation process comprising multiple sets of different scanning signals being outputted to the each of M scanning lines, except for a scanning confirmation line, at different logic levels, each of the multiple sets of different scanning signals outputting a first logic level to the scanning confirmation line said microprocessor acquires a plurality of sensing signals from a sensing confirmation line to perform a logic operation on said sensing signals to acquire a sensed value, and said microprocessor determines the state of said one of said switching elements coupled to said scanning confirmation line and said sensing confirmation line according to said sensed value.

2. The keyboard of claim 1, wherein said scanning confirmation process using one of said scanning lines as said scanning confirmation line and one of said sensing lines as said sensing confirmation line to repeatedly output multiple sets of scanning signals being different through said scanning lines.

3. The keyboard of claim 2, wherein said multiple sets of said scanning signals being different and outputted to said scanning confirmation line are at a first logic level, and said multiple sets of said scanning signals being different and outputted to said scanning lines except for said scanning confirmation line vary in a range from a second logic level to a high-impedance logic level, wherein said first logic level enables said one of said switching elements coupled to said scanning confirmation line to be turned on when being pressed, wherein said range from said second logic level to said high-impedance logic level enables said one of said switching elements coupled to said scanning lines except for said scanning confirmation line to be forbidden to be turned on when being pressed.

4. The keyboard of claim 1, wherein said logic operation is an OR logic operation performed by said microprocessor acquiring said plurality of said sensing signals from said sensing confirmation line.

5. The keyboard of claim 1, wherein N and M are positive integers and the resistance of said first resistor is larger than the resistance of said second resistors.

6. The keyboard of claim 1, further comprising M reverse-current protection circuits, each of said reverse-current protection circuits is coupled to one of said scanning lines.

7. A keyboard scanning method for a keyboard scanning circuit, said keyboard scanning circuit comprising a plurality of switching elements, M scanning lines, and N sensing lines, each of said sensing lines having a common node extended to M transmission lines, wherein one of said switching elements is provided where one of said transmission lines and one of said scanning lines intersects, and two of said scanning lines coupled through two of said switching elements to two of said transmission lines extended from one of said sensing line are different from each other, said keyboard scanning method comprising:
outputting a scanning signal through said scanning lines;
receiving a sensing signal through said sensing lines; and
determining the state of each of said switching elements according to said sensing signal;
wherein said common node of each of said sensing lines is coupled to a first resistor and M second resistors, wherein said first resistor is directly coupled between a voltage source and said common node, and said second resistors are directly coupled between said common node and said transmission lines;
wherein the number of said switching elements is defined by the product of the number of said scanning lines and the number of said sensing lines; and
wherein the state of each of said switching elements is determined by performing a scanning confirmation process on one of said switching elements, said scanning confirmation
process comprising:
outputting multiple sets of different scanning signals having varying logic levels to the each of M scanning lines, except for a scanning confirmation line, each of the multiple sets of different scanning signals outputting a first logic level to the scanning confirmation line;
acquiring said plurality of said sensing signals from a sensing confirmation line to perform a logic operation on said sensing signals to acquire a sensed value; and
determining the state of said one of said switching elements coupled to the scanning confirmation line and said sensing confirmation line according to said sensed value.

8. The keyboard scanning method of claim 7, wherein said scanning confirmation process further comprises:
using one of said scanning lines as said scanning confirmation line;
using one of said sensing lines as said sensing confirmation line; and
repeatedly outputting multiple sets of scanning signals being different through said scanning lines.

9. The keyboard scanning method of claim 8, wherein said multiple sets of said scanning signals being different and outputted to said scanning confirmation line are at a first logic level, and said multiple sets of said scanning signals being different and outputted to said scanning lines except for said scanning confirmation line vary in a range from a second logic level to a high-impedance logic level, wherein said first logic level enables said one of said switching elements coupled to said scanning confirmation line to be turned on when being pressed, wherein said range from said second logic level to said high-impedance logic level enables said one of said switching elements coupled to said scanning lines except for said scanning confirmation line to be forbidden to be turned on when being pressed.

10. The keyboard scanning method of claim 7, wherein said logic operation is an OR logic operation performed by said microprocessor acquiring said plurality of said sensing signals from said sensing confirmation line.

11. The keyboard scanning method of claim 10, wherein said one of said switching elements coupled to said scanning confirmation line and said sensing confirmation line is determined to be turned on when said sensed value is at a first logic level, and said one of said switching elements coupled to said scanning confirmation line and said sensing confirmation line is determined to be turned off when said sensed value is at a second logic level.

12. A keyboard, comprising:
a plurality of switching elements;
M scanning lines;
N sensing lines, each of said sensing lines having a common node extended to M transmission lines; and
a microprocessor; coupled to said scanning lines and said sensing lines; wherein one of said switching elements is provided where one of said transmission lines and one of said scanning lines intersects, and two of said scanning lines coupled through two of said switching elements to two of said transmission lines extended from one of said sensing line are different from each other; and
wherein said microprocessor determines the state of each of said switching elements by performing a scanning confirmation process on one of said switching elements, said scanning confirmation process using one of said sensing lines coupled to said one of said switching elements as a sensing confirmation line to repeatedly output multiple sets of scanning signals being different through said scanning lines except for a scanning confirmation line, each output of the multiple sets of scanning signals outputting a first logic level to the scanning confirmation line, and said microprocessor acquires a plurality of sensing signals from said sensing confirmation line to perform a logic operation on said sensing signals to acquire a sensed value and said microprocessor determines the state of said one of said switching elements according to said sensed value.

* * * * *